(12) United States Patent
Saito

(10) Patent No.: US 9,264,064 B2
(45) Date of Patent: Feb. 16, 2016

(54) ANALOG-TO-DIGITAL CONVERSION APPARATUS AND ANALOG-TO-DIGITAL CONVERSION METHOD

(71) Applicant: Panasonic Intellectual Property Management Co., Ltd., Osaka (JP)

(72) Inventor: Ayuhiko Saito, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/577,193

(22) Filed: Dec. 19, 2014

(65) Prior Publication Data

US 2015/0256194 A1  Sep. 10, 2015

(30) Foreign Application Priority Data

Mar. 7, 2014 (JP) ................. 2014-045647

(51) Int. Cl.
*H03M 1/12* (2006.01)
*H03M 3/00* (2006.01)

(52) U.S. Cl.
CPC ............. *H03M 3/46* (2013.01); *H03M 3/438* (2013.01)

(58) Field of Classification Search
CPC ....... H03M 3/456; H03M 1/12; H03M 3/458; H03M 3/438; H03M 3/30; H03M 3/02; H03M 1/00; H03M 1/001; H03M 1/02; H03M 7/3033; H03M 7/3042; H03M 3/46

USPC .......................................... 341/155, 143, 121
See application file for complete search history.

(56) References Cited

U.S. PATENT DOCUMENTS

| | | | |
|---|---|---|---|
| 6,456,219 B1 * | 9/2002 | Schreiber et al. ............. 341/155 |
| 7,557,742 B2 * | 7/2009 | Kulinets et al. ............... 341/143 |
| 7,825,838 B1 * | 11/2010 | Srinivas et al. ............... 341/121 |
| 7,889,108 B2 | 2/2011 | Hamashita et al. | |
| 8,704,694 B2 | 4/2014 | Kawahito | |
| 2009/0278721 A1 | 11/2009 | Hamashita et al. | |
| 2013/0120180 A1 | 5/2013 | Kawahito | |

FOREIGN PATENT DOCUMENTS

| | | |
|---|---|---|
| JP | 2009-273131 | 11/2009 |
| JP | 2012-114641 | 6/2012 |
| WO | 2011/142452 | 11/2011 |

* cited by examiner

*Primary Examiner* — Jean B Jeanglaude
(74) *Attorney, Agent, or Firm* — Wenderoth, Lind & Ponack, L.L.P.

(57) ABSTRACT

An analog-to-digital conversion apparatus includes: a second or higher order ΔΣ analog-to-digital converter which receives input of analog data and generates a digital modulated signal including more significant bits; a cyclic analog-to-digital convertor which receives input of an analog signal and generates a multi-bit digital value of less significant bits, the analog signal being included in the analog data and having not been subjected to ΔΣ processing by the ΔΣ analog-to-digital converter.

10 Claims, 14 Drawing Sheets

High-order ΔΣ analog-to-digital convertor

Cyclic analog-to-digital convertor

FIG. 8

| | | The number of bits | Amplifier gain (MAX) | clk cycle | Total | Comments |
|---|---|---|---|---|---|---|
| ΔΣ only | ΔΣ | 12 bits | 36 dB | 91 cycles | 91 cycles | More cycles are necessary ⇒ high-speed analog-to-digital conversion is difficult to achieve |
| | cyclic | 0 bit | - | 0 cycle | | |
| Hybrid ① | ΔΣ | 7 bits | 36 dB | 16 cycles | 21 cycles | The number of cycles: large (disadvantageous for high-speed analog-to-digital conversion) |
| | cyclic | 5 bits | 30 dB | 5 cycles | | |
| Hybrid ② | ΔΣ | 6 bits | 36 dB | 11 cycles | 17 cycles | ↕ |
| | cyclic | 6 bits | 36 dB | 6 cycles | | |
| Hybrid ③ | ΔΣ | 5 bits | 36 dB | 9 cycles | 16 cycles | The number of cycles: small (advantageous for high-speed analog-to-digital conversion) |
| | cyclic | 7 bits | 42 dB | 7 cycles | | |
| Cyclic only | ΔΣ | 0 bit | - | 0 cycle | 12 cycles | High amplifier gain is necessary |
| | cyclic | 12 bits | 72 dB | 12 cycles | | |

ANALOG-TO-DIGITAL CONVERSION APPARATUS AND ANALOG-TO-DIGITAL CONVERSION METHOD

CROSS REFERENCE TO RELATED APPLICATION

The present application is based on and claims priority of Japanese Patent Application No. 2014-045647 filed on Mar. 7, 2014. The entire disclosure of the above-identified application, including the specification, drawings and claims is incorporated herein by reference in its entirety.

FIELD

The present disclosure relates to an analog-to-digital conversion apparatus and an analog-to-digital conversion method.

BACKGROUND

There is an interest in digital output image sensors as an imaging device which generates high-definition videos and still images. The digital output image sensor includes, for example, an imaging area having pixels disposed in rows and columns, a row selection circuit, a horizontal scan circuit, and an analog-to-digital conversion circuit which performs an analog-to-digital conversion on an analog pixel signal output from the imaging area into a digital output signal. The digital output image sensor employs, for example, a column parallel analog-to-digital conversion scheme in which an analog-to-digital converter is disposed for each column of pixels. In other words, analog-to-digital converters as many as the number of columns of pixels are disposed in the column parallel analog-to-digital conversion scheme. Thus, the number of analog-to-digital converters increases to achieve higher-definition and a larger number of pixels. This requires each analog-to-digital converter to generate a more precise digital output signal at a higher speed.

Patent Literature (PTL) 1 discloses a configuration of a solid-state imaging device which includes, to achieve a high-speed digital output image sensor, an analog-to-digital conversion circuit in which cyclic analog-to-digital converters are serially connected in two stages. According to this, one cyclic analog-to-digital converter generates digital values of more significant bits, and another cyclic analog-to-digital converter generates digital values of less significant bits. Thus, processing of reading out an analog pixel signal and analog-to-digital conversion process can be performed in parallel, thereby allowing a high-speed digital output image sensor.

CITATION LIST

Patent Literature

[PTL 1] Japanese Unexamined Patent Application Publication No. 2012-114641

SUMMARY

Technical Problem

The present disclosure provides an analog-to-digital conversion apparatus and an analog-to-digital conversion method which allow high-speed analog-to-digital conversion of a large number of bits.

Solution to Problem

An analog-to-digital conversion apparatus according to an aspect of the present disclosure is an analog-to-digital conversion apparatus which converts an analog input signal into a digital output signal, including a second or higher order $\Delta\Sigma$ analog-to-digital converter which receives input of the analog input signal and generates a digital modulated signal including more significant bits, and a cyclic analog-to-digital converter which receives input of analog data which is included in the analog input signal and having not been subjected to $\Delta\Sigma$ processing by the $\Delta\Sigma$ analog-to-digital converter, and generates a multi-bit digital value of less significant bits.

Advantageous Effects

According to the analog-to-digital conversion apparatus and an analog-to-digital conversion method of the present disclosure, high-speed analog-to-digital conversion of a large number of bits is allowed.

BRIEF DESCRIPTION OF DRAWINGS

These and other objects, advantages and features of the invention will become apparent from the following description thereof taken in conjunction with the accompanying drawings that illustrate specific embodiments of the present disclosure.

FIG. 8 is a diagram depicting the relationship between a bit budget and the number of clock cycles in the second-order $\Delta\Sigma$ analog-to-digital conversion process and in the cyclic analog-to-digital conversion process.

DESCRIPTION OF EMBODIMENTS (Underlying Knowledge Forming Basis of the Present Disclosure)

Figure 12:
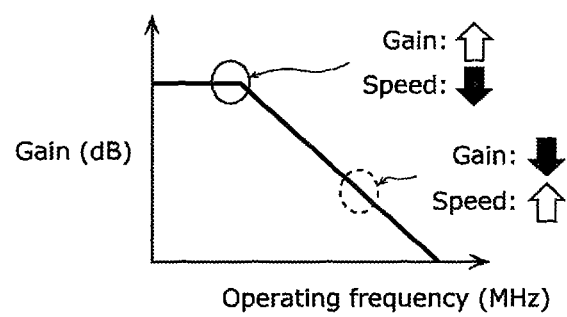
FIG. 12 is a graph showing the relationship between operating frequency and gain of an inverting amplifier included in an analog-to-digital converter.

In relation to the analog-to-digital conversion circuit described in the Background section, the inventors have found the following problems:

FIG. 12 is a graph showing relationship between operating frequency and gain of an inverting amplifier included in an analog-to-digital converter. As shown in the figure, the inverting amplifier included in the analog-to-digital converter has maximum gain (performance limits of inverting amplifier gain) at a low frequency and gain decreases with an increase in operating frequency. In other words, securing high gain reduces the operating frequency, which makes high-speed analog-to-digital (also referred to as AD, hereinafter) conversion difficult to achieve.

When an analog-to-digital converter which includes an inverting amplifier converts an analog input voltage into a multi-bit digital signal, 6 dB is required as the inverting amplifier gain to generate a 1-bit digital value. For example, 72 dB (6 dB×12 bit: 4096-fold) is required as the inverting amplifier gain for an analog-to-digital converter to output a 12-bit ($2^{12}$=4096 tones) digital signal.

To obtain a more precise digital output signal including a larger number of bits, the analog-to-digital conversion circuit of the solid-state imaging device disclosed in PTL 1 is required to increase gain of an amplifier included in the cyclic analog-to-digital converter. To output a 12-bit digital signal as described in the above example, the cyclic analog-to-digital converter is required to include an amplifier which has 72 dB gain. However, the use of an amplifier alone which has 72 dB gain reduces the operating frequency of the amplifier significantly, according to the characteristics of the inverting amplifier depicted in FIG. 12. Thus, high-speed analog-to-digital conversion is not achieved. Additionally, there are disadvantages, such as an increase in cost to achieve 72 dB by an amplifier alone. Conversely, if the gain performance of amplifier is degraded to prioritize high-speed analog-to-digital conversion, a large number of bits cannot be AD converted. In other words, it is difficult for the solid-state imaging device disclosed in PTL 1 to achieve high-speed analog-to-digital conversion of a large number of bits.

The analog-to-digital conversion apparatus according to the present disclosure is thus made to address the problems described above, and provides an analog-to-digital conversion apparatus and an analog-to-digital conversion method which allow high-speed analog-to-digital conversion of a large number of bits.

An analog-to-digital conversion apparatus according to an aspect of the present disclosure is an analog-to-digital conversion apparatus for performing analog-to-digital conversion on an analog input signal into a digital output signal, including: a second or higher order $\Delta\Sigma$ analog-to-digital converter which receives input of the analog input signal and generates a digital modulated signal including more significant bits; and a cyclic analog-to-digital converter which receives input of an analog signal and generates a multi-bit digital value of less significant bits, the analog signal being included in the analog input signal and having not been subjected to $\Delta\Sigma$ processing by the $\Delta\Sigma$ analog-to-digital converter.

The inventors have found that connecting the inverting amplifiers in cascade in the $\Delta\Sigma$ analog-to-digital converter yields gain across the $\Delta\Sigma$ analog-to-digital converter that is equivalent to a sum of gains of the inverting amplifiers, while allowing high-speed operation of the overall $\Delta\Sigma$ analog-to-digital converter at an operating frequency corresponding to gain of one inverting amplifier.

Thus, according to the above configuration, since the digital modulated signal including the more significant bits is subjected to the signal processing by the second or higher order $\Delta\Sigma$ analog-to-digital convertor, a large number of bits corresponding to a sum of gains of the inverting amplifiers can be AD converted. Moreover, the operating frequency of each inverting amplifier is defined by gain of the inverting amplifier alone, and thus high-speed operation of the analog-to-digital conversion process on the more significant bits is secured as well. On the other hand, the digital values of the less significant bits are subjected to the signal processing by the cyclic analog-to-digital convertor. Thus, the required accuracy degrades as the process continues a less significant bit, along which the required gain from the inverting amplifier can be reduced. In other words, in the analog-to-digital conversion process on the less significant bits, the operating frequency can be set higher as the process continues to a less significant bit, speeding up the analog-to-digital conversion process. Thus, a hybridized analog-to-digital conversion process, in which the high-order $\Delta\Sigma$ analog-to-digital conversion process is performed on the more significant bits and the cyclic analog-to-digital conversion process is performed on the less significant bits, allows high-speed analog-to-digital conversion of a large number of bits.

Moreover, the $\Delta\Sigma$ analog-to-digital converter includes a first inverting amplifier and a second inverting amplifier, and the cyclic analog-to-digital converter includes at least one of the first inverting amplifier or the second inverting amplifier which is shared with the $\Delta\Sigma$ analog-to-digital converter.

This allows area savings and cost reduction of the analog-to-digital conversion apparatus.

Moreover, the analog-to-digital conversion apparatus further includes: a binarization processing unit configured to demodulate the digital modulated signal generated by the $\Delta\Sigma$ analog-to-digital converter into a multi-bit digital value of the more significant bits; and a digital output unit configured to combine the multi-bit digital value of the less significant bits and the multi-bit digital value of the more significant bits to output the digital output signal.

According to the above configuration, the cyclic analog-to-digital converter can generate a multi-bit digital value of the less significant bits while the binarization processing unit is demodulating the digital modulated signal generated by the $\Delta\Sigma$ analog-to-digital converter into the multi-bit digital value of the more significant bits. This allows the digital output unit to combine the multi-bit digital value of the more significant bits and the multi-bit digital value of the less significant bits along with the output timing of the multi-bit digital value of the more significant bits and the multi-bit digital value of the less significant bits, without a loss of time. Thus, high-speed analog-to-digital conversion of a large number of bits is allowed.

Moreover, the analog-to-digital conversion apparatus further includes a clock control unit configured to control clock cycles which are time periods where unit processes of the analog-to-digital conversion are performed by the $\Delta\Sigma$ analog-to-digital converter and the cyclic analog-to-digital converter, wherein the clock control unit is configured to set at least one of the clock cycles to be used by the cyclic analog-to-digital converter longer than a shortest one of the clock cycles to be used by the ΔΣ analog-to-digital converter.

Moreover, the clock control unit is configured to set the clock cycles to be used by the cyclic analog-to-digital converter so that a shorter clock cycle is used to generate a less significant bit.

According to the above configuration, the gain of the inverting amplifier is highest when the cyclic analog-to-digital converter processes a most significant bit, and the clock cycle for most significant bit has a slowest speed. However, the gain of the inverting amplifier may be reduced as the process continues to a less significant bit. Thus, an increased speed of processing a less significant bit is allowed. The ΔΣ analog-to-digital converter, on the other hand, can operate at a higher speed than a clock cycle for the most significant bit processed by the cyclic analog-to-digital converter. Thus, high-speed analog-to-digital conversion of a large number of bits is allowed.

Moreover, the number of bits of digital values generated by the cyclic analog-to-digital converter is half or more of a total number of bits of the digital output signal.

Clock cycles used in the cyclic analog-to-digital converter can be shortened as the process continues to a less significant bit. On the other hand, to perform analog-to-digital conversion on the input analog signal, the ΔΣ analog-to-digital converter operates at a high-speed at the operating frequency corresponding to gain that is half the gain required from an amplifier alone. Thus, if the cyclic analog-to-digital converter processes a number of less significant bits which is half of a total number of bits, the required gain for the most significant bit among the less significant bits is substantially equal to the required gain from the ΔΣ analog-to-digital converter. In contrast, if the number of bits processed by the cyclic analog-to-digital converter is half or more of the total number of bits, the required gain for the most significant bit among the less significant bits is greater than the required gain from the ΔΣ analog-to-digital converter. However, a total duration of the clock cycles used by the cyclic analog-to-digital converter can be reduced with an increase in the number of bits processed, thereby achieving high-speed analog-to-digital conversion.

Moreover, an analog-to-digital conversion apparatus according to an aspect of the present disclosure is an analog-to-digital conversion apparatus including: a first analog-to-digital convertor which generates digital values of more significant bits in clock cycles; a second analog-to-digital convertor which generates digital values of less significant bits in clock cycles; and a clock control unit configured to control the clock cycles which are time periods where the first analog-to-digital convertor and the second analog-to-digital convertor perform unit processes of analog-to-digital conversion, wherein the clock control unit is configured to set the clock cycles to be used by the second analog-to-digital convertor so that a shorter clock cycle is used to generate a digital value of a less significant bit, and set at least one of the clock cycles to be used by the second analog-to-digital convertor longer than a shortest one of the clock cycles to be used by the first analog-to-digital convertor.

According to the above configuration, since a longest clock cycle to be used by the second analog-to-digital convertor which generates the digital values of the less significant bits is set longer than the clock cycles to be used by the first analog-to-digital convertor, the second analog-to-digital convertor can process half or more of the total number of bits of the digital output signal. Herewith, the second analog-to-digital convertor drops the gain of the amplifier as the process continues to a less significant bit to shorten clock cycles. Thus, high-speed analog-to-digital conversion of a large number of bits is allowed by the hybridized analog-to-digital conversion process configured of the analog-to-digital conversion process for more significant bits where high gain is required, and analog-to-digital conversion process for less significant bits that can be speeded up.

It should be noted that the present disclosure can be achieved not only in an analog-to-digital conversion apparatus which includes the characteristic means as described above, but also in an analog-to-digital conversion method which includes the characteristic means included in the analog-to-digital conversion apparatus, as steps.

Hereinafter, embodiments according to the present disclosure will be described in detail, with reference to the accompanying drawings. It should be noted that the same reference signs refer to the same or like parts throughout and the description will not be repeated.

It should be noted that embodiments described below are each merely an illustration of the present disclosure. Values, shapes, materials, components, arrangement or connection between the components, steps, and the order of the steps are merely illustrative and not intended to limit the present disclosure. The present disclosure is indicated by the appended claims. Thus, among components of the embodiments below, components not set forth in the independent claims indicating the top level concept of the present disclosure are not necessary to achieve the present disclosure but will be described as components for preferable embodiments.

Embodiment 1

Configuration of Analog-to-Digital Conversion Apparatus

Figure 1:
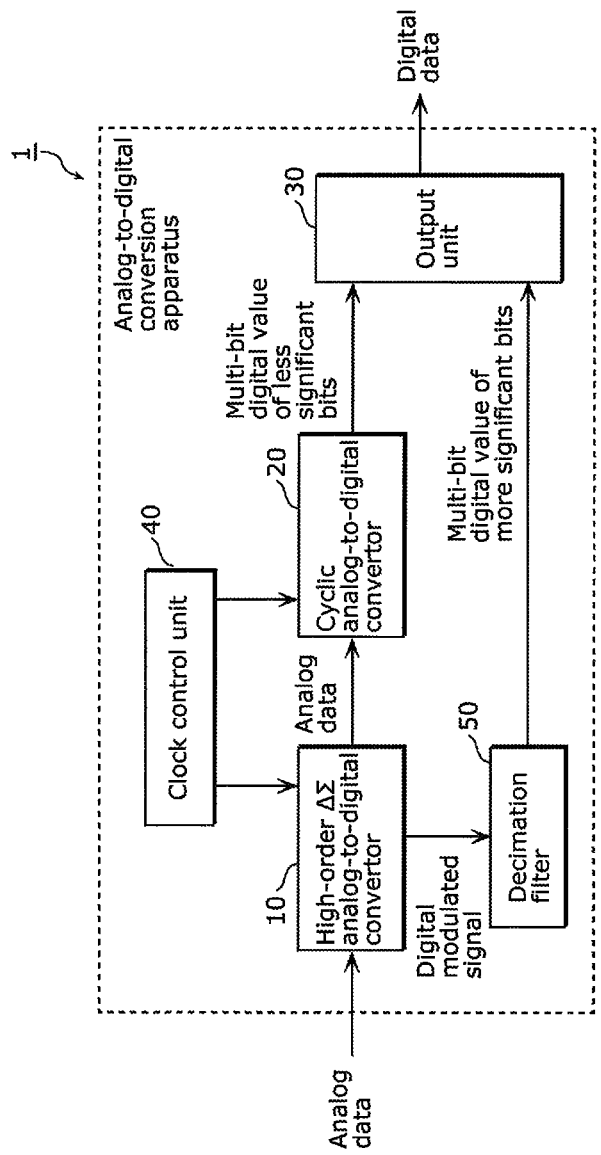
FIG. 1 is a block diagram of an analog-to-digital conversion apparatus according to a non-limiting embodiment 1.

FIG. 1 is a block diagram of an analog-to-digital conversion apparatus according to a non-limiting embodiment 1. An analog-to-digital conversion apparatus 1 shown in the figure includes a high-order ΔΣ analog-to-digital convertor 10, a cyclic analog-to-digital convertor 20, an output unit 30, a clock control unit 40, and a decimation filter 50. The analog-to-digital conversion apparatus 1 converts analog data into digital data.

The high-order ΔΣ analog-to-digital convertor 10 is a second or higher order ΔΣ analog-to-digital converter which receives input of analog data and generates a digital modulated signal including more significant bits. Here, the second or higher order ΔΣ analog-to-digital converter is a ΔΣ analog-to-digital converter which includes two or more amplifiers and the two or more amplifiers each perform a signal amplification process.

The high-order ΔΣ analog-to-digital convertor 10 according to the present embodiment includes a Δ (subtraction) circuit which obtains a difference between a fixed voltage value and a voltage value of analog data which is an input signal, a Σ (addition) circuit which adds a result of the subtraction one after another, a quantization circuit which performs threshold comparison on a result of the addition to set a bit to "1" or "0," and a feedback circuit which operates in response to output of the quantization circuit. The high-order ΔΣ analog-to-digital convertor 10 according to the present embodiment further includes two amplifiers, the specific description of which will be described below.

The cyclic analog-to-digital convertor 20 is a cyclic analog-to-digital converter which receives input of analog data, which is included in the input signal and having not been subjected to the ΔΣ processing by the high-order ΔΣ analogto-digital convertor 10, and generates a multi-bit digital value of less significant bits. The cyclic analog-to-digital convertor 20 according to the present embodiment performs threshold determination on the input analog signal to conduct binary search sequentially from the most significant bit (MSB) among the less significant bits to the least significant bit (LSB) to set each bit to "1" or "0."

The clock control unit 40 controls clock cycles which are time periods in which the high-order ΔΣ analog-to-digital convertor 10 and the cyclic analog-to-digital convertor 20 each perform a unit process of analog-to-digital conversion. More specifically, the clock control unit 40 controls timing of switching the switches included in the high-order ΔΣ analog-to-digital convertor 10 and the cyclic analog-to-digital convertor 20 between a conductive state and a non-conductive state.

The decimation filter 50 is a binarization processing unit which demodulates the digital modulated signal generated by the high-order ΔΣ analog-to-digital convertor 10 to a multi-bit digital value of more significant bits. For example, the decimation filter 50 is a low pass filter.

The output unit 30 is a digital output unit which combines the multi-bit digital value of the less significant bits generated by the cyclic analog-to-digital convertor 20 and the multi-bit digital value of the more significant bits generated by the decimation filter 50 to output multi-bit digital data.

According to the above configuration, the cyclic analog-to-digital convertor 20 can generate a multi-bit digital value of the less significant bits while the decimation filter 50 is demodulating the digital modulated signal generated by the high-order ΔΣ analog-to-digital convertor 10 into to the multi-bit digital value of the more significant bits. Then, the output unit 30 can combine the multi-bit digital value of the more significant bits and the multi-bit digital value of the less significant bits along with the output timing of the multi-bit digital value of the more significant bits and the multi-bit digital value of the less significant bits, without a loss of time. Thus, high-speed analog-to-digital conversion of a large number of bits is allowed.

[Gain-Operating Frequency Characteristics of Analog-to-Digital Convertor]

Hereinafter, features of the high-order ΔΣ analog-to-digital convertor 10 and the cyclic analog-to-digital convertor 20 according to the present embodiment will be described, illustrating their specific configurations.

Figure 2A:
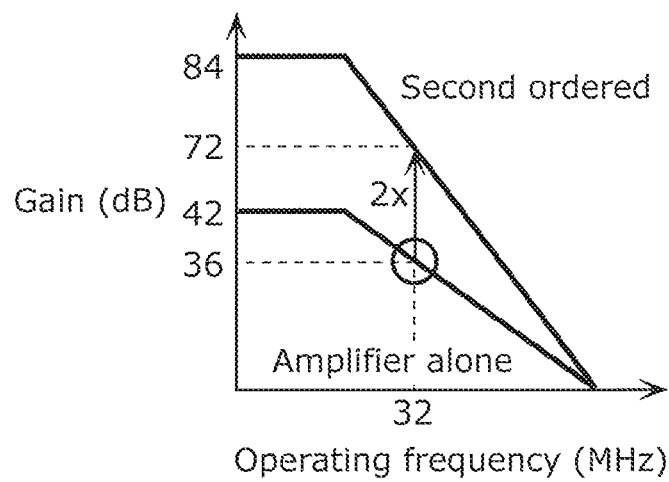
FIG. 2A is a graph depicting relationship between operating frequency and gain of inverting amplifiers included in a high-order $\Delta\Sigma$ analog-to-digital convertor according to the embodiment 1.
Figure 2B:
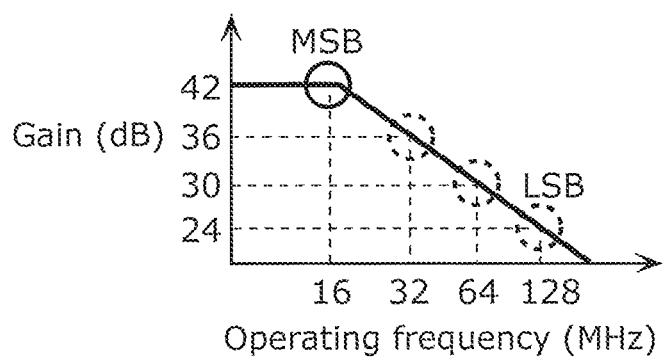
FIG. 2B is a graph depicting relationship between operating frequency and gain of an inverting amplifier included in a cyclic analog-to-digital converter according to the embodiment 1.

FIG. 2A is a graph showing the relationship between operating frequency and gain of the inverting amplifiers included in the high-order ΔΣ analog-to-digital convertor 10 according to the embodiment 1. FIG. 2B is a graph showing the relationship between operating frequency and gain of the inverting amplifier included in the cyclic analog-to-digital convertor 20 according to the embodiment 1. FIGS. 2A and 2B depict characteristics of the inverting amplifiers included in the analog-to-digital convertor. The inverting amplifiers included in the analog-to-digital convertor have maximum gain (performance limits of the inverting amplifier gain) at low frequencies. A higher operating frequency results in a decrease in gain. In other words, securing high gain reduces the operating frequency, which makes high-speed analog-to-digital conversion difficult to achieve.

The graph in FIG. 2A shows characteristics of one inverting amplifier (an amplifier alone) included in the high-order ΔΣ analog-to-digital convertor 10, and characteristics of two inverting amplifiers connected in series. The amplifier alone has, for example, 42 dB gain maximum at a low frequency, and the gain decreases with an increase in the operating frequency. A ΔΣ analog-to-digital converter which includes one inverting amplifier having these characteristics is required to have 6 dB amplifier gain to generate a 1-bit digital value, and thus, is limited to generate a 7-bit digital signal maximum.

In contrast, the analog-to-digital conversion apparatus 1 according to the present embodiment includes, as an analog-to-digital convertor which generates the digital values of the more significant bits, the high-order ΔΣ analog-to-digital convertor 10 including two inverting amplifier connected in series. The inventors have found that connecting the inverting amplifiers in cascade in the ΔΣ analog-to-digital converter yields gain across the ΔΣ analog-to-digital converter that is equivalent to a sum of gains of the inverting amplifiers, while achieving high-speed operation of the overall ΔΣ analog-to-digital converter at an operating frequency corresponding to gain of one inverting amplifier. According to this configuration, the gain across the high-order ΔΣ analog-to-digital convertor 10 is 84 dB (42 dB×2) maximum (at the low frequency). On the other hand, for a 12-bit output, the high-order ΔΣ analog-to-digital convertor 10 is required to have 36 dB gain from one amplifier alone. In other words, a 12-bit output can be achieved even if the amplifier gain decreases by 6 dB from a maximum gain of 42 dB. The decrease of the amplifier gain by 6 dB can be used to speed up the operating frequency. In other words, the amplifier alone is operated in a range where the amplifier gain may decrease, prioritizing high-speed operating frequency (time saving), while securing the analog-to-digital conversion of a large number of bits.

The graph in FIG. 2B shows characteristics of the inverting amplifier included in the cyclic analog-to-digital convertor 20. Unlike the ΔΣ analog-to-digital converter described above, the cyclic analog-to-digital converter cannot accommodate a plurality of inverting amplifiers connected in series. Thus, if the cyclic analog-to-digital converter is disposed to generate a multi-bit digital value of more significant bits, only one inverting amplifier can be disposed for amplification operation, which leads to a low operating frequency when attempting to obtain high gain using one inverting amplifier. Due to this, the analog-to-digital conversion apparatus 1 according to the present embodiment does not include the cyclic analog-to-digital converter for the purpose of generating a multi-bit digital value of the more significant bits. Thus, in the analog-to-digital conversion apparatus 1 according to the present embodiment, the cyclic analog-to-digital converter is disposed to generate a multi-bit digital value of less significant bits, and one inverting amplifier conducts binary search sequentially from a most significant bit (MSB) to a least significant bit (LSB) to generate a digital value for each bit.

In the cyclic analog-to-digital convertor 20 according to the present embodiment, as the process continues to a less significant bit the required accuracy of gain reduces by half. Thus, as shown in FIG. 2B, the inverting amplifier operates at the operating frequency of 16 MHz for MSB to have 42 dB gain, and the operating frequency is increased to decrease gain each by 6 dB as the process continues to a less significant bit. More specifically, for MSB (seventh bit), the cyclic analog-to-digital convertor 20 determines whether MSB is greater than or equal to a threshold in 128 tones ($2^7$ tones) to set MSB to Hi (1) or Lo (0). Thus, a minimum of 128-fold (42 dB) is required as the inverting amplifier gain for MSB. Next, for the sixth bit, whether the sixth bit is greater than or equal to a threshold in 64 tones ($2^6$ tones) is determined to set the sixth bit to Hi (1) or Lo (0). Thus, a minimum of 64-fold (36 dB) is required as the inverting amplifier gain for the sixth bit. Next, for the fifth bit, whether the fifth bit is greater than or equal to a threshold in 32 tones ($2^5$ tones) is determined to set the fifth bit to Hi (1) or Lo (0). Thus, a minimum of 32-fold (30 dB) is required as the inverting amplifier gain for the fifth bit. The same processing is performed on the subsequent bits in order. Last, for the first bit, whether the first bit is greater than or equal to a threshold in 2 tones ($2^1$ tones) is determined to set the first bit to Hi (1) or Lo (0). Thus, a minimum of 2-fold (6 dB) is required as the inverting amplifier gain for the first bit.

[Configuration and Operation of High-Order ΔΣ Analog-to-Digital Convertor]

Figure 3A:
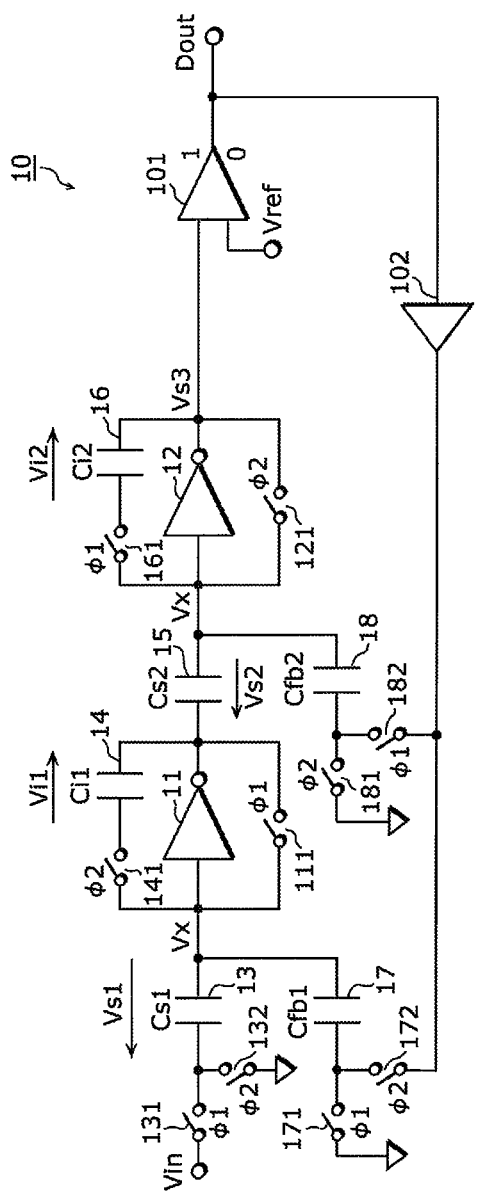
FIG. 3A is a diagram showing an example of a circuit structure of the high-order $\Delta\Sigma$ analog-to-digital convertor according to the embodiment 1.

FIG. 3A is a diagram showing an example of a circuit structure of the high-order ΔΣ analog-to-digital convertor according to the embodiment 1. The high-order ΔΣ analog-to-digital convertor 10 shown in the figure includes inverting amplifiers 11 and 12, capacitors 13, 14, 15, 16, 17, and 18, switches 111, 121, 131, 132, 141, 161, 171, 172, 181, and 182, a comparator 101, and a digital-to-analog convertor (DAC) 102. As shown in FIG. 3A, the high-order ΔΣ analog-to-digital convertor 10 includes the inverting amplifier 11, which is a first inverting amplifier, and the inverting amplifier 12, which is a second inverting amplifier connected to the inverting amplifier 11 in series. The inverting amplifiers 11 and 12 are connected in series via the capacitor 15.

In the circuit structure shown in FIG. 3A, the preceding unit process configured of Δ (subtraction) processing and Σ (addition) processing is performed by the preceding circuit which includes the inverting amplifier 11, the capacitors 13, 14, and 17, and switches 111, 131, 132, 141, 171, and 172. The subsequent unit process configured of Δ (subtraction) processing and Σ (addition) processing is performed by the subsequent circuit which includes the inverting amplifier 12, the capacitors 15, 16, and 18, and the switches 121, 161, 181, and 182. The comparator 101 is a quantization circuit which performs threshold comparison on an output signal from the subsequent circuit to set each bit to "1" or "0." The DAC 102 is a feedback circuit which operates in response to output of the comparator 101.

Hereinafter, circuit operation of the high-order ΔΣ analog-to-digital convertor 10 will be described.

Figure 3B:
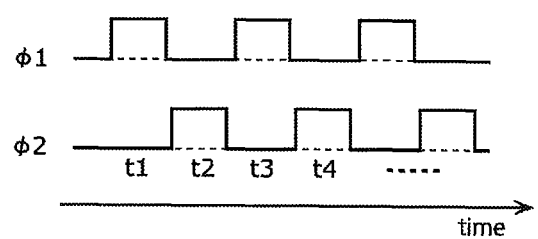
FIG. 3B is a timing diagram of the operation of the high-order $\Delta\Sigma$ analog-to-digital convertor according to the embodiment 1.

FIG. 3B is a timing diagram of the operation of the high-order ΔΣ analog-to-digital convertor according to the embodiment 1. The timing diagram illustrated in FIG. 3B depicts a conductive state and a non-conductive state of the switches included in the high-order ΔΣ analog-to-digital convertor 10, the high-level period indicating that the switch is in the conductive state, the low-level period indicating that the switch is in the non-conductive state. The clock control unit 40 controls the switches mentioned above.

First, in a time period t1, the clock control unit 40 makes the switch 131 conductive. This applies an analog input voltage Vin to a first electrode of the capacitor 13. At the same time, the clock control unit 40 makes the switch 111 conductive. This applies a short-circuit voltage Vx of the inverting amplifier 11 to a second electrode of the capacitor 13. Thus, an accumulated charge Qs1 on the capacitor 13 changes to Cs1(Vin−Vx).

Next, in a time period t2, the clock control unit 40 makes the switches 141 and 132 conductive. This transfers the accumulated charge Qs1 on the capacitor 13 to the capacitor 14. At the same time, the clock control unit 40 makes the switch 172 conductive. This applies an output voltage from the DAC 102 to a first electrode of the capacitor 17.

Here, the DAC 102 outputs a power supply voltage VDD (V) if output Dout of the comparator 101 is 1, and outputs GND (0V) if the output Dout of the comparator 101 is 0, for example. This changes an accumulated charge Qfb1 on the capacitor 17 to Cfb1×VDD if the output Dout is 1, and to 0 if the output Dout is 0. Then, the accumulated charge Qs1 on the capacitor 13 and the accumulated charge Qfb1 on the capacitor 17 are subjected to the Δ (subtraction) processing to change an accumulated charge Qi1 on the capacitor 14 to (Qs1−Qfb1+Q0). A voltage Vi1 of the capacitor 14 is changed to (Qs1−Qfb1+Q0)/Ci1. It should be noted that Q0 is an initial value.

Furthermore, in the time period t2, the clock control unit 40 makes the switch 121 conductive. This applies the short-circuit voltage Vx of the inverting amplifier 12 to a second electrode of the capacitor 15. This applies Vs2=Vi1 to the capacitor 15. An accumulated charge on the capacitor 15 is changed to (Qs1−Qfb1+Q0)Cs2/Ci1.

Next, in a time period t3, the clock control unit 40 makes the switch 161 conductive. This transfers an accumulated charge Qs2 on the capacitor 15 to the capacitor 16. At the same time, the clock control unit 40 makes the switch 182 conductive. This applies the output voltage from the DAC 102 to a first electrode of the capacitor 18. Thus, an accumulated charge Qfb2 on the capacitor 18 is changed to Cfb2×VDD if the output Dout is 1, and to 0 if the output Dout is 0. In other words, the accumulated charge Qs2 on the capacitor 15 and the accumulated charge Qfb2 on the capacitor 18 are subjected to the Δ (subtraction) processing to change an accumulated charge Qi2 on the capacitor 16 to (Qs2−Qfb2+Q0). Here, a comparator input voltage Vs3=Vx+(Qs2−Qfb2+Q0)/Ci2 is applied to an output terminal of the inverting amplifier 12 (an input terminal of the comparator 101).

Moreover, in the time period t3, the preceding circuit performs the same operation as performed in the time period t1.

Next, in a time period t4, the comparator 101 determines the comparator input voltage Vs3. Specifically, the comparator 101 outputs "1" (VDD) if the comparator input voltage Vs3 is greater than or equal to a reference compare voltage Vref, and outputs "0" (GND) if the comparator input voltage Vs3 is less than the reference compare voltage Vref.

In time periods subsequent to the time period t4, the high-order ΔΣ analog-to-digital convertor 10 repeats the operations that have been performed in the time periods t3 and t4.

The clock control unit 40 included in the high-order ΔΣ analog-to-digital convertor 10 performs the operation as described above. It should be noted that the time period t1 plus the time period t2 constitutes a clock cycle which is a time period where the high-order ΔΣ analog-to-digital convertor 10 performs a unit process of the analog-to-digital conversion. Since the analog input voltage Vin is always input in each clock cycle in the analog-to-digital conversion operation performed by the high-order ΔΣ analog-to-digital convertor 10, the operating frequency is constant. Thus, the length of the clock cycle is set constant.

It should be noted that in the high-order ΔΣ analog-to-digital convertor 10, the comparator operation may extend depending on an initial voltage. This may extend the first clock cycle, and thus the high-order ΔΣ analog-to-digital conversion operation according to the present embodiment is not limited to a constant length of the clock cycle.

A second-order ΔΣ analog-to-digital converter can process [n(n+1)/2] tones in n clock cycles. For example, the second-order ΔΣ analog-to-digital converter can process 45 tones in nine clock cycles, which allows generation of a 5-bit ($2^5$=32 tones) digital value maximum.

[Configuration and Operation of Cyclic Analog-to-Digital Convertor]

Figure 4A:
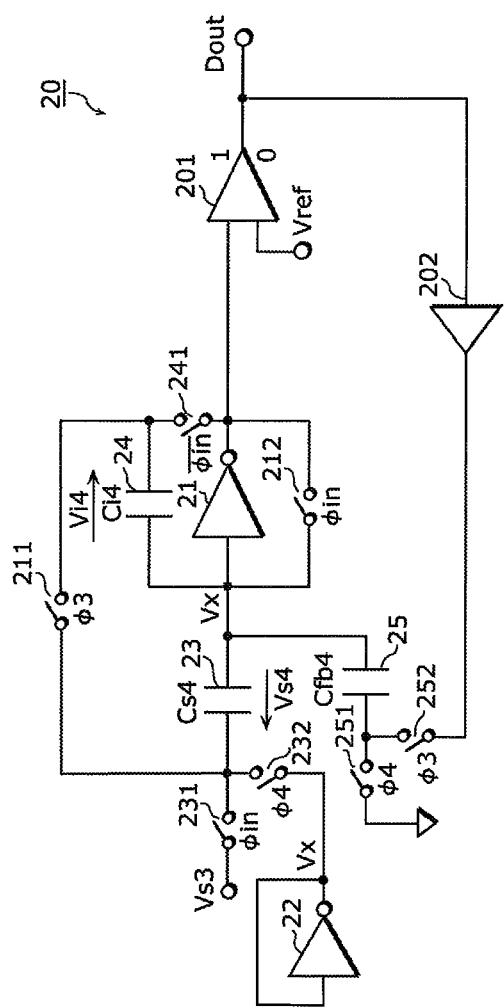
FIG. 4A is a diagram showing an example of a circuit structure of the cyclic analog-to-digital converter according to the embodiment 1.

FIG. 4A is a diagram showing an example of a circuit structure of the cyclic analog-to-digital convertor 20 according to the embodiment 1. The cyclic analog-to-digital convertor 20 shown in the figure includes inverting amplifiers 21 and 22, capacitors 23, 24, and 25, switches 211, 212, 231, 232, 241, 251, and 252, a comparator 201, and a digital-to-analog convertor (DAC) 202. As shown in the circuit structure of FIG. 4A, the cyclic analog-to-digital convertor 20 according to the present embodiment includes the inverting amplifier 21, which amplifies an analog voltage, and a reference inverting amplifier 22 which generates the short-circuit voltage Vx for cancelling an offset voltage of the inverting amplifier 21.

Hereinafter, circuit operation of the cyclic analog-to-digital convertor 20 will be described.

Figure 4B:
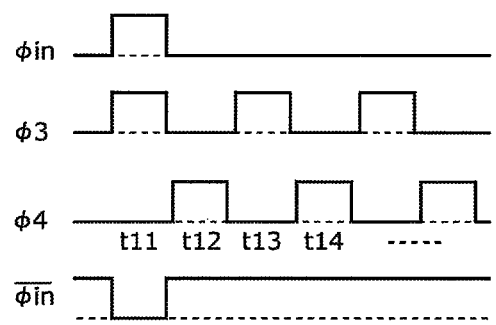
FIG. 4B is a timing diagram of the operation of the cyclic analog-to-digital converter according to the embodiment 1.

FIG. 4B is a timing diagram of the operation of the cyclic analog-to-digital convertor 20 according to the embodiment 1. The timing diagram illustrated in FIG. 4B depicts a conductive state and a non-conductive state of the switches included in the cyclic analog-to-digital convertor 20, the high-level period indicating that the switch is in the conductive state, the low-level period indicating that the switch is in the non-conductive state. The clock control unit 40 controls the switches mentioned above.

First, in a time period t11, the clock control unit 40 makes the switches 231 and 211 conductive. This applies an output voltage Vs3 of the high-order $\Delta\Sigma$ analog-to-digital convertor 10 when the analog-to-digital conversion process on the more significant bits is finished to a first electrode of the capacitor 23 and a second electrode of the capacitor 24. Moreover, the clock control unit 40, at the same time, makes the switch 212 conductive. This applies the short-circuit voltage Vx of the inverting amplifier 21 to a second electrode of the capacitor 23 and a first electrode of the capacitor 24. Thus, an accumulated charge Qs4 on the capacitor 23 is changed to Cs4(Vs3−Vx) and the accumulated charge Qi4 on the capacitor 24 is changed to Ci4(Vs3−Vx).

Next, in a time period t12, the clock control unit 40 makes the switches 232 and 251 conductive. The switch 232 is made conductive and thereby the short-circuit voltage Vx of the inverting amplifier 22 for cancelling the offset voltage is applied to the first electrode of the capacitor 23 and the second electrode of the capacitor 24. This transfers the accumulated charge Qs4 on the capacitor 23 and the accumulated charge Qfb4 on the capacitor 25 to the capacitor 24.

Next, in a time period t13, the clock control unit 40 makes the switch 211 conductive. This applies a voltage Vi4 of the capacitor 24 to the capacitor 23 to change the accumulated charge Qs4 on the capacitor 23 to Cs4×Vi4.

Moreover, in the time period t13, the comparator 201 determines a comparator input voltage Vi4. Specifically, the comparator 201 outputs "1" if the comparator input voltage Vi4 is greater than or equal to the reference compare voltage Vref, and outputs "0" if the comparator input voltage Vi4 is less than the reference compare voltage Vref. Here, the DAC 202 outputs the power supply voltage VDD (V) if the output Dout of the comparator 201 is 1, and outputs 0 (V) if the output Dout of the comparator 201 is 0, for example. This changes the accumulated charge Qfb2 on the capacitor 25 to Cfb4× VDD if the output Dout is 1, and to 0 and if the output Dout is 0.

Next, in a time period t14, the clock control unit 40 makes the switches 232 and 251 conductive. This transfers the accumulated charge Qs4 on the capacitor 23 and the accumulated charge Qfb4 on the capacitor 25 to the capacitor 24.

In time periods subsequent to the time period t14, the cyclic analog-to-digital convertor 20 repeats the operations that have been performed in the time periods t13 and t14.

The clock control unit 40 included in the cyclic analog-to-digital convertor 20 performs the operation as described above. It should be noted that the time period t13 plus the time period t14 constitutes a clock cycle which is a time period where the cyclic analog-to-digital convertor 20 performs a unit process of the analog-to-digital conversion. The cyclic analog-to-digital convertor 20 generates a 1-bit digital value during one clock cycle. In other words, the cyclic analog-to-digital convertor 20 can process $2^n$ tones in n clock cycles. For example, the cyclic analog-to-digital convertor 20 can process 32 tones in five clock cycles, which allows generation of a 5-bit ($2^5$=32 tones) digital value. In the analog-to-digital conversion operation by the cyclic analog-to-digital convertor 20, the required accuracy degrades as the clock cycle advances. Thus, the operating frequency can be set higher as the process continues to a less significant bit, thereby shortening clock cycles.

Figure 5:
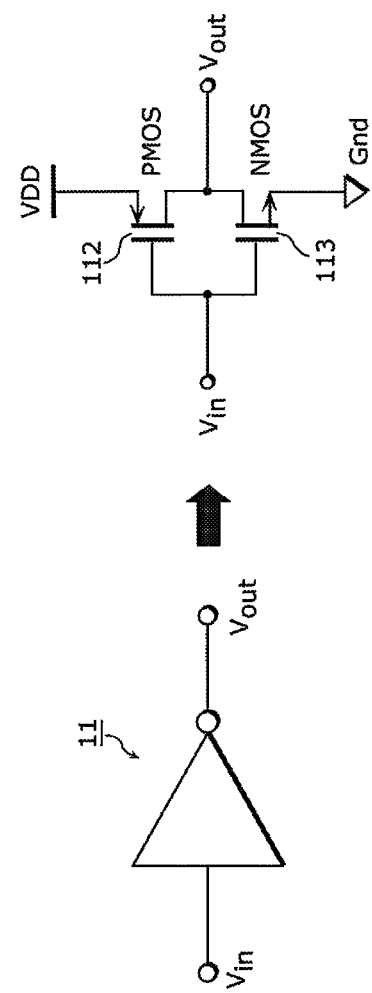
FIG. 5 is a diagram showing an example of a circuit structure of the inverting amplifier.

FIG. 5 is a diagram showing an example of a circuit structure of the inverting amplifier. In the figure, a circuit structure of the inverting amplifiers included in the high-order $\Delta\Sigma$ analog-to-digital convertor 10 and the cyclic analog-to-digital convertor 20 is illustrated. The inverting amplifier according to the present embodiment is configured with, for example, an inverter circuit. For example, the inverting amplifier 11 includes a PMOS transistor 112 an NMOS transistor 113 connected in series between a power supply terminal having the power supply voltage VDD and a ground terminal having the ground voltage GND. The inverting amplifier 11 has an input terminal connected to gate terminals of the PMOS transistor 112 and the NMOS transistor 113 and has an output terminal connected to drain terminals of the PMOS transistor 112 and the NMOS transistor 113. Due to the above connection configuration, for example, if the input voltage Vin having a positive voltage value is input to the inverting amplifier 11, the NMOS transistor 113 is made conductive and the PMOS transistor 112 is made non-conductive, and the inverting amplifier 11 outputs 0V (GND). On the other hand, if the input voltage Vin having 0V is input to the inverting amplifier 11, the NMOS transistor 113 is made non-conductive and the PMOS transistor 112 is made conductive, and the inverting amplifier 11 outputs the power supply voltage (VDD).

[Analog-to-Digital Conversion Method]

Next, an analog-to-digital conversion method will be described which implements the analog-to-digital conversion operation performed by the analog-to-digital conversion apparatus 1 which includes the high-order $\Delta\Sigma$ analog-to-digital convertor 10 and the cyclic analog-to-digital convertor 20 described above.

Figure 6:
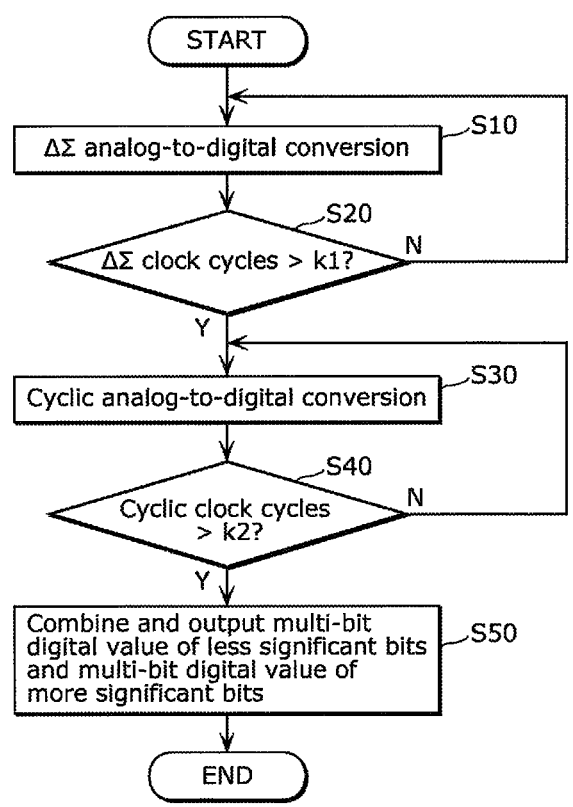
FIG. 6 is an operational timing diagram illustrating an analog-to-digital conversion method according to the embodiment 1.

FIG. 6 is an operational timing diagram illustrating an analog-to-digital conversion method according to the embodiment 1.

First, a second or higher order $\Delta\Sigma$ analog-to-digital conversion process is repeatedly performed on the analog input data to be subjected to the analog-to-digital conversion, for a number of clock cycles (k1 times) required to generate digital values of more significant bits (S10 and S20). This generates the digital values of the more significant bits. Specifically, the high-order $\Delta\Sigma$ analog-to-digital convertor 10 generates, from the input analog data, a digital modulated signal including the more significant bits and outputs the digital modulated signal to the decimation filter 50. Then, the decimation filter 50 demodulates the digital modulated signal into a multi-bit digital value of the more significant bits and outputs the demodulated multi-bit digital value of the more significant bits to the output unit 30.

Next, the cyclic analog-to-digital conversion process is repeatedly performed on analog data which is included in the input analog data and has not been subjected to the high order $\Delta\Sigma$ processing, for a number of clock cycles (k2 times)

required to generate digital values of less significant bits (S30 and S40). This generates a multi-bit digital value of the less significant bits.

Last, the multi-bit digital value of the less significant bits and the multi-bit digital value of the more significant bits are combined to output digital output data (S50).

According to the analog-to-digital conversion method of the present embodiment, since the digital modulated signal including the more significant bits is generated through the second or higher order ΔΣ analog-to-digital conversion process, a large number of bits corresponding to a sum of gains of the inverting amplifiers can be subjected to the analog-to-digital conversion. Moreover, the operating frequency of each amplifier is defined by gain of an amplifier alone, and thus high-speed operation of the analog-to-digital conversion process on the more significant bits is secured as well. On the other hand, the multi-bit digital value of the less significant bits is generated through the cyclic analog-to-digital conversion process. Thus, the required accuracy degrades as the process continues to a less significant bit, along which the required gain from the amplifier can be reduced. In other words, in the analog-to-digital conversion process on the less significant bits, the operating frequency can be set higher as the process continues to a less significant bit, speeding up the analog-to-digital conversion process. Thus, the high-order ΔΣ analog-to-digital conversion process is performed on the more significant bits and the cyclic analog-to-digital conversion process is performed on the less significant bits, thereby allowing high-speed analog-to-digital conversion of a large number of bits.

[Clock Cycle Control]

Figure 7:
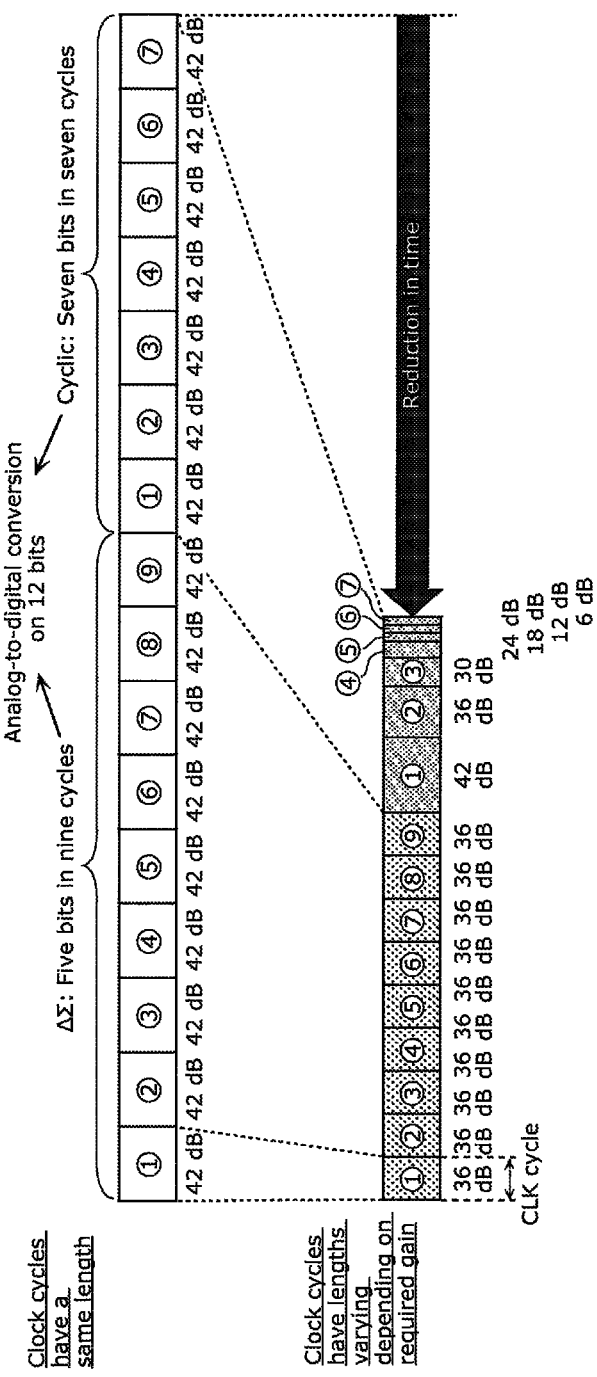
FIG. 7 is a diagram illustrating clock cycles in an analog-to-digital conversion operation.

FIG. 7 is a diagram illustrating clock cycles in the analog-to-digital conversion operation. In the figure, comparison is illustrated between the case where clock cycles having a same length is used for the unit processes (top) and the case where the length of each clock cycle varies depending on the required gain (bottom). FIG. 7 shows the case where 12-bit digital data is to be output. To output the 12-bit digital data, 12 bit×6 dB=72 dB gain is required as the inverting amplifier gain.

Concerning this, the analog-to-digital conversion apparatus 1 according to the present embodiment employs the high-order ΔΣ analog-to-digital convertor 10 which includes two stages of the inverting amplifiers to generate the digital values of the more significant bits. Therefore, the clock control unit 40 sets the clock cycles of the high-order ΔΣ analog-to-digital convertor 10 so that each of the inverting amplifiers of the high-order ΔΣ analog-to-digital convertor 10 has 36 dB (72 dB/2) gain.

FIG. 8 is a diagram depicting the relationship between a bit budget and the number of clock cycles in the second-order ΔΣ analog-to-digital conversion process and in the cyclic analog-to-digital conversion process. The figure shows the number of bits processed by the high-order ΔΣ analog-to-digital convertor 10 and the cyclic analog-to-digital convertor 20, the required gain, the number of clock cycles, and a total number of clock cycles to output 12-bit digital data. The figure also shows five bit budgets (ΔΣ 12 bits, ΔΣ 7 bits and cyclic 5 bits, ΔΣ 6 bits and cyclic 6 bits, ΔΣ 5 bits and cyclic 7 bits, cyclic 12 bits) from top to bottom.

As shown in FIG. 8, it can be seen that the total number of clock cycles decreases with an increase of the number of bits processed by the cyclic analog-to-digital convertor 20, which is advantageous for achieving high-speed analog-to-digital conversion. However, the gain for MSB in the cyclic analog-to-digital convertor 20 need to be set higher with an increase of the number of bits processed by the cyclic analog-to-digital convertor 20.

Besides the result shown in FIG. 8 that an increase in the number of bits processed by the cyclic analog-to-digital convertor 20 is advantageous for achieving high-speed analog-to-digital conversion, the clock cycles can be shortened as the process continues to a less significant bit in the cyclic analog-to-digital convertor 20 which generates the digital values of the less significant bits. Due to this, it is advantageous for achieving high-speed analog-to-digital conversion that the number of clock cycles used by the cyclic analog-to-digital convertor 20 is larger than the number of clock cycles used by the high-order ΔΣ analog-to-digital convertor 10.

According to the above, the following design guidelines are presented: (1) to perform analog-to-digital conversion on a large number of bits, 36 dB gain is secured for each inverting amplifier of the high-order ΔΣ analog-to-digital convertor 10, and (2) to achieve high-speed analog-to-digital conversion, the number of clock cycles used by the cyclic analog-to-digital convertor 20 is maximized.

In this respect, preferably, the number of bits processed by the high-order ΔΣ analog-to-digital convertor 10 is five bits (a clock cycle time corresponding to 36 dB gain×9), and the number of bits processed by the cyclic analog-to-digital convertor 20 is seven bits (a clock cycle time corresponding to gain that depends on the progress to a bit×7). Here, since the number of bits processed by the cyclic analog-to-digital convertor 20 is set to seven bits, the cyclic analog-to-digital convertor 20 is required to have 42 dB gain (7 bit×6 dB) for MSB. In other words, to cause the cyclic analog-to-digital convertor 20 to process a number of less significant bits which is greater than half of a total number of bits of the digital output signal, the required gain for MSB from the cyclic analog-to-digital convertor 20 is greater than the required gain from the high-order ΔΣ analog-to-digital convertor 10. In other words, the clock control unit 40 sets at least one of the plurality of clock cycles used by the cyclic analog-to-digital convertor 20 longer than the shortest one of the plurality of clock cycles used by the high-order ΔΣ analog-to-digital convertor 10.

In the present embodiment, the clock control unit 40 controls each switch, in accordance with the allocation of the clock cycle time as described above (bottom of FIG. 7). As shown in FIG. 7, it can be seen that the processing time can be significantly reduced, as compared with the case where all clock cycles has the length of a longest clock cycle. Thus, high-speed analog-to-digital conversion of a large number of bits is allowed.

As described above, according to the analog-to-digital conversion apparatus 1 of the present embodiment, since the digital modulated signal including more significant bits is subjected to the signal processing by the high-order ΔΣ analog-to-digital convertor 10, a large number of bits corresponding to a sum of gains of the inverting amplifiers can be AD converted. Moreover, the operating frequency of each inverting amplifier is defined by gain of the inverting amplifier alone, and thus high-speed operation of the analog-to-digital conversion process on the more significant bits is secured as well. On the other hand, the digital values of the less significant bits are subjected to the signal processing by the cyclic analog-to-digital convertor 20. Thus, the analog signal voltage to be processed decreases as the process continues a less significant bit, along which the required gain from the inverting amplifier can be reduced. In other words, in the analog-to-digital conversion process on the less significant bits, the operating frequency can be set higher as the process continues to a less significant bit, speeding up the analog-to-digital conversion process. Thus, a hybridized analog-to-digital conversion process, in which the high-order ΔΣ analog-to-digital conversion process is performed on the more significant bits and the cyclic analog-to-digital conversion process is performed on the less significant bits, allows high-speed analog-to-digital conversion of a large number of bits.

Embodiment 2

An analog-to-digital conversion apparatus according to a non-limiting embodiment 2 has a configuration where the inverting amplifier 12 that is included in the high-order ΔΣ analog-to-digital convertor 10 according to the embodiment 1 and performs the subsequent amplification process and the inverting amplifier 21 that is included in the cyclic analog-to-digital convertor 20 and performs the amplification process are combined. This allows area savings and cost reduction of the apparatus, while securing the high-speed analog-to-digital conversion of a large number of bits achieved by the analog-to-digital conversion apparatus 1.

[Circuit Structure of Analog-to-Digital Conversion Apparatus]

Figure 9:
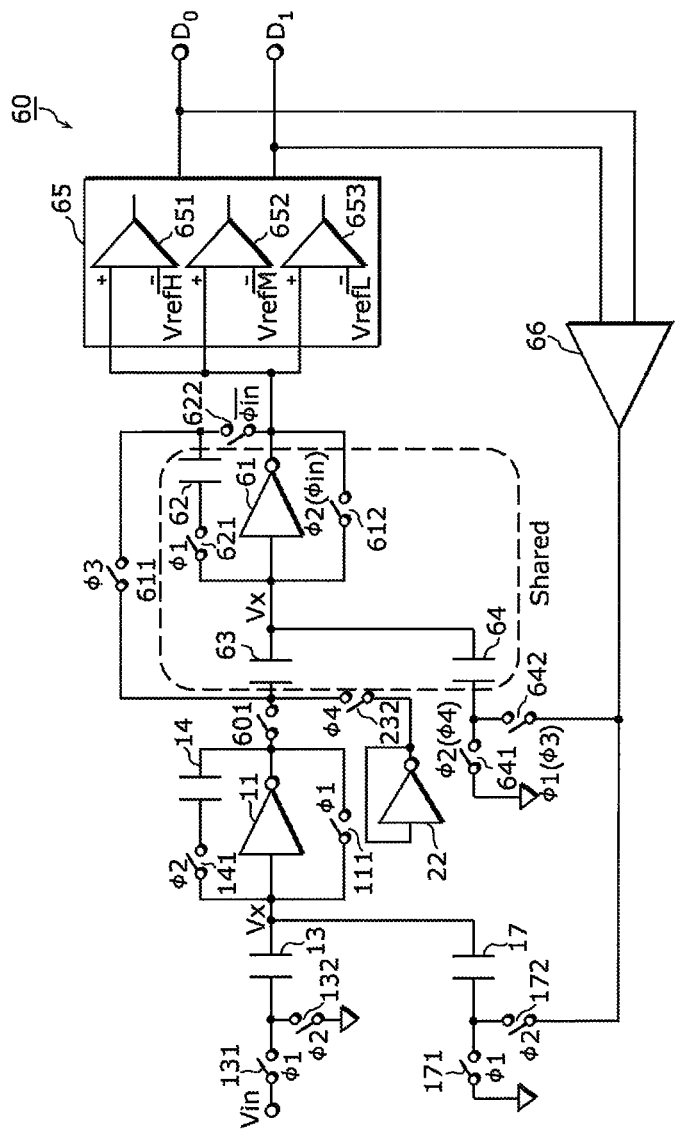
FIG. 9 is a diagram showing an example of a circuit structure of an analog-to-digital conversion apparatus according to a non-limiting embodiment 2.

FIG. 9 is a diagram showing an example of a circuit structure of the analog-to-digital conversion apparatus according to the embodiment 2. An analog-to-digital conversion apparatus 60 shown in the figure includes inverting amplifiers 11, 22, and 61, capacitors 13, 14, 17, 62, 63, and 64, switches 601, 111, 131, 132, 141, 171, 172, 232, 611, 612, 621, 622, 641, and 642, a comparator unit 65, and a digital-to-analog converter (DAC) 66.

The circuit shown in FIG. 9 includes both a high-order ΔΣ analog-to-digital convertor and a cyclic analog-to-digital convertor, and performs both the analog-to-digital conversion process performed by the high-order ΔΣ analog-to-digital convertor 10 according to the embodiment 1 and the analog-to-digital conversion process performed by the cyclic analog-to-digital convertor 20. Here, in the analog-to-digital conversion apparatus 60, an inverting amplifier and its peripheral circuitry included the high-order ΔΣ analog-to-digital convertor to perform a high-order amplification process and an inverting amplifier and its peripheral circuitry included in the cyclic analog-to-digital convertor to perform the amplification process are combined. In other words, the cyclic analog-to-digital convertor includes an inverting amplifier 61 which is shared with the high-order ΔΣ analog-to-digital convertor. This is due to a similar circuit structure the high-order ΔΣ analog-to-digital convertor and the cyclic analog-to-digital convertor have. The shared inverting amplifier and its peripheral circuitry are the inverting amplifier 61 and the capacitors 62, 63, and 64. Hereinafter, the high-order ΔΣ analog-to-digital conversion operation and the cyclic analog-to-digital conversion operation in the circuit shown in FIG. 9 will be described.

[High-Order ΔΣ Analog-to-Digital Conversion Operation]

Figure 10:
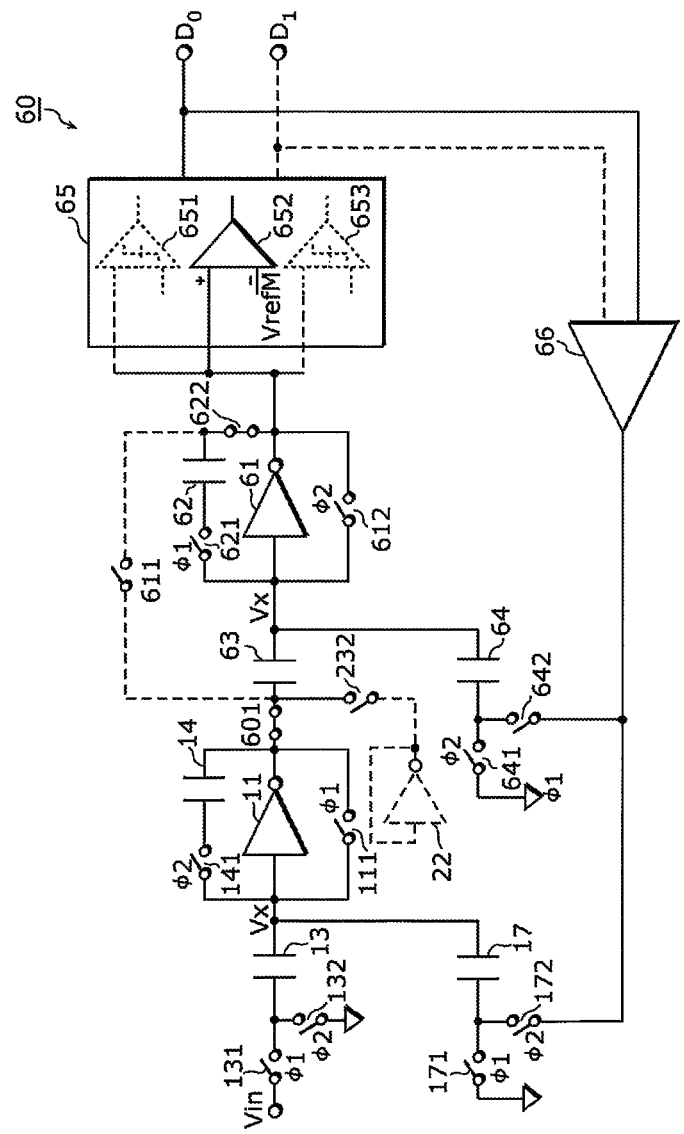
FIG. 10 is a circuit structure diagram when the analog-to-digital conversion apparatus according to the embodiment 2 performs high-order $\Delta\Sigma$ analog-to-digital conversion.

FIG. 10 is a circuit structure diagram when the analog-to-digital conversion apparatus according to the embodiment 2 performs the high-order ΔΣ analog-to-digital conversion. In FIG. 10, shown in dashed lines are circuit components of the analog-to-digital conversion apparatus 60 that are not allowed to function as the high-order ΔΣ analog-to-digital convertor.

In performing the high-order ΔΣ analog-to-digital conversion operation according to the present embodiment, a clock control unit 40, first, makes the switch 601 conductive and makes the switches 611 and 232 non-conductive. This implements the high-order ΔΣ analog-to-digital convertor in circuit connection state.

The subsequent circuit operation is performed according to the operational timing diagram of the embodiment 1 in FIG. 3B.

First, in a time period t1, the clock control unit 40 makes the switch 131 conductive. At the same time, the clock control unit 40 makes the switch 111 conductive. This changes an accumulated charge Qs1 on the capacitor 13 to Cs1(Vin−Vx).

Next, in a time period t2, the clock control unit 40 makes the switches 141 and 132 conductive. This transfers the accumulated charge Qs1 on the capacitor 13 to the capacitor 14. At the same time, the clock control unit 40 makes the switch 172 conductive. Due to this, the accumulated charge Qs1 on the capacitor 13 and an accumulated charge Qfb1 on the capacitor 17 are subjected to the Δ (subtraction) processing to change an accumulated charge Qi1 on the capacitor 14 to (Qs1−Qfb1+Q0). This also changes a voltage Vi1 of the capacitor 14 to (Qs1−Qfb1+Q0)/Ci1.

Furthermore, in the time period t2, the clock control unit 40 makes the switch 612 conductive. This applies a short-circuit voltage Vx of an inverting amplifier 61 to a second electrode of the capacitor 63. Moreover, Vs2=Vi1 is applied to the capacitor 63, changing the accumulated charge Qs2 on the capacitor 63 to (Qs1−Qfb1+Q0)Cs2/Ci1.

Next, in a time period t3, the clock control unit 40 makes the switch 621 conductive. This transfers an accumulated charge Qs2 on the capacitor 63 to the capacitor 62. At the same time, the clock control unit 40 makes the switch 642 conductive. This changes an accumulated charge Qfb2 on the capacitor 64 to Cfb2×VDD if output Do is 1, and to 0 if the output Do is 0. In other words, the accumulated charge Qs2 on the capacitor 63 and the accumulated charge Qfb2 on the capacitor 64 are subjected to the Δ (subtraction) processing to change an accumulated charge Qi2 on the capacitor 62 to (Qs2−Qfb2+Q0). Here, a comparator input voltage Vs3=Vx+(Qs2−Qfb2+Q0)/Ci2 is applied to an output terminal of the inverting amplifier 61 (an input terminal of the comparator unit 65).

Moreover, in the time period t3, the preceding circuit performs the same operation as performed in the time period t1.

Next, in a time period t4, the comparator unit 65 determines the comparator input voltage Vs3. Specifically, the comparator unit 65 outputs "1" (VDD) if the comparator input voltage Vs3 is greater than or equal to a reference compare voltage VrefM, and outputs "0" (GND) if the comparator input voltage Vs3 is less than the reference compare voltage VrefM.

In time periods subsequent to the time period t4, the analog-to-digital conversion apparatus 60 repeats the operations that have been performed in the time periods t3 and t4.

The clock control unit 40 performs the high-order ΔΣ analog-to-digital conversion operation as described above. It should be noted that the time period t1 plus the time period t2 constitutes a clock cycle which is a time period where a unit process of the high-order ΔΣ analog-to-digital conversion is performed. In the high-order ΔΣ analog-to-digital conversion operation, the analog input voltage Vin is always input in each clock cycle, and thus the operating frequency is constant and the length of the clock cycle is constant.

[Cyclic Analog-to-Digital Conversion Operation]

Figure 11:
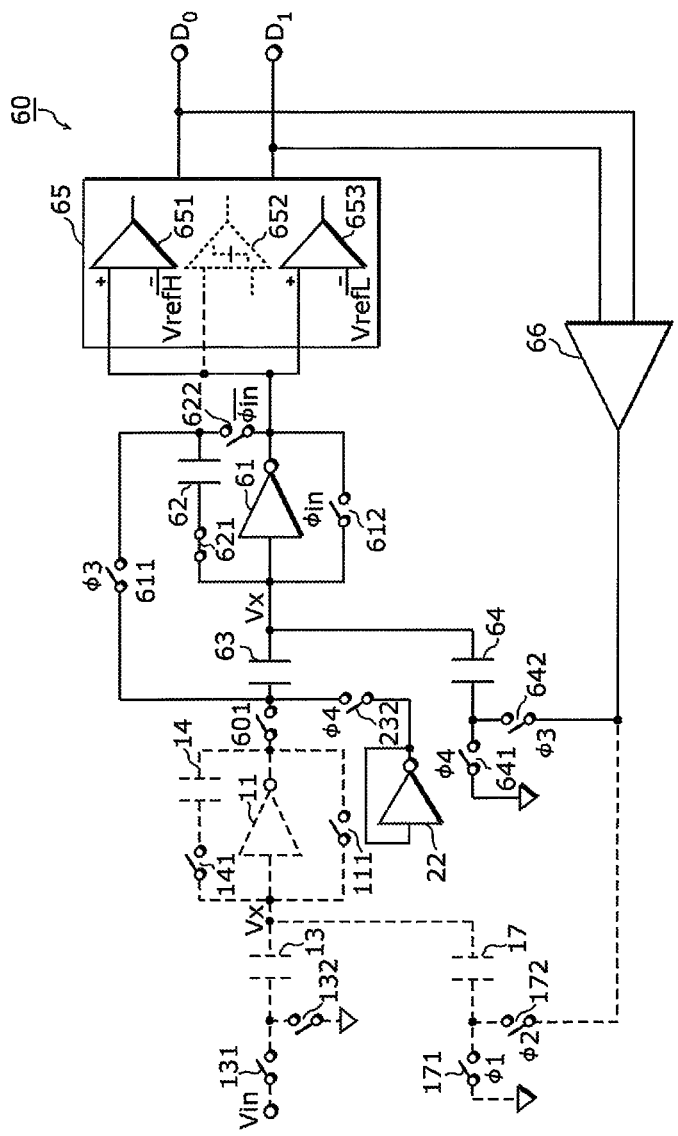
FIG. 11 is a circuit structure diagram when the analog-to-digital conversion apparatus according to the embodiment 2 performs cyclic analog-to-digital conversion.

FIG. 11 is a circuit structure diagram when the analog-to-digital conversion apparatus according to the embodiment 2 performs the cyclic analog-to-digital conversion. In FIG. 11, shown in dashed lines are circuit components of the analog-to-digital conversion apparatus 60 that are not allowed to function as the cyclic analog-to-digital convertor.

Circuit operation for the cyclic analog-to-digital conversion is performed according to the operational timing diagram of the embodiment 1 in FIG. 4B.

First, in a time period t11, the clock control unit 40 makes the switch 611 conductive. The clock control unit 40, at the same time, makes the switch 612 conductive as well. This applies an output voltage Vs3 of the high-order ΔΣ analog-to-digital convertor 10 when the analog-to-digital conversion process on the more significant bits is finished to a first electrode of the capacitor 63 and a second electrode of the capacitor 62. This changes an accumulated charge Qi4 on the capacitor 62 to Ci2(Vs3−Vx) and an accumulated charge Qs4 on the capacitor 63 to Cs2(Vs3−Vx).

Next, in a time period t12, the clock control unit 40 makes the switches 232 and 641 conductive. This transfers the accumulated charge Qs4 on the capacitor 63 and an accumulated charge Qfb4 on the capacitor 64 to the capacitor 62.

Next, in a time period t13, the clock control unit 40 makes the switch 611 conductive. This changes the accumulated charge Qs4 on the capacitor 63 to Cs2×Vi4.

Moreover, in the time period t13, the comparator unit 65 determines a comparator input voltage Vi4. Specifically, comparators 651 and 653 output a ternary (1.5-bit) digital value (00, 01, 10), depending on whether the comparator input voltage Vi4 is above or below reference compare voltages VrefH and VrefL, respectively. It should be noted that in the present embodiment, to secure the accuracy of the cyclic analog-to-digital conversion operation, the configuration employing two comparators 651 and 653 are illustrated.

Next, in a time period t14, the clock control unit 40 makes the switches 232 and 641 conductive. This transfers the accumulated charge Qs4 on the capacitor 63 and the accumulated charge Qfb4 on the capacitor 64 to the capacitor 24.

In time periods subsequent to the time period t14, the analog-to-digital conversion apparatus 60 repeats the operations that have been performed in the time periods t13 and t14.

The clock control unit 40 performs the cyclic analog-to-digital conversion operation as described above. It should be noted that the time period t13 plus the time period t14 constitutes a clock cycle which is a time period where a unit process of the cyclic analog-to-digital conversion operation is performed. The cyclic analog-to-digital conversion operation generates a 1-bit digital value during one clock cycle. Moreover, in the cyclic analog-to-digital conversion operation, the required accuracy degrades as the clock cycle advances. Thus, the operating frequency can be set higher as the process continues to a less significant bit, thereby shortening the clock cycles.

According to the present embodiment, the inverting amplifier which is used as the high-order ΔΣ analog-to-digital conversion circuit and its peripheral circuitry and the inverting amplifier which is used as a cyclic analog-to-digital conversion circuit and its peripheral circuitry are combined. This achieves area savings and cost reduction of the analog-to-digital conversion apparatus.

It should be noted that in the analog-to-digital conversion apparatus 60 according to the embodiment 2, the inverting amplifier 22 used in the cyclic analog-to-digital conversion operation and the inverting amplifier 11 used in the high-order ΔΣ analog-to-digital conversion operation can be combined. This achieves further area savings and cost reduction.

In the present embodiment, to secure the accuracy in the cyclic analog-to-digital conversion output, the comparator 652 is used in the high-order ΔΣ analog-to-digital conversion operation, and the comparators 651 and 653 are used in the cyclic analog-to-digital conversion operation. However, the same comparator may be used in the high-order ΔΣ analog-to-digital conversion operation and the cyclic analog-to-digital conversion operation, if there is no problem with sharing the voltage VrefM with the voltage VrefH or VrefL in the high-order ΔΣ analog-to-digital conversion operation.

Other Embodiment

While the analog-to-digital conversion apparatuses the analog-to-digital conversion methods according to the embodiments 1 and 2 have been described above, the present disclosure is not limited to these embodiments.

For example, the analog-to-digital conversion apparatus according to the present disclosure is not limited to processing a digital modulated signal including more significant bits by a high-order ΔΣ analog-to-digital converter and processing a multi-bit digital value of less significant bits by a cyclic analog-to-digital convertor. For example, the analog-to-digital conversion apparatus according to the present disclosure includes the first analog-to-digital convertor which generates digital values of more significant bits in a plurality of clock cycles, the second analog-to-digital convertor which generates digital values of less significant bits in a plurality of clock cycles, and the clock control unit which controls the clock cycles which are time periods where the first analog-to-digital convertor and the second analog-to-digital convertor perform unit processes of analog-to-digital conversion. The clock control unit included in the second analog-to-digital convertor sets the clock cycles so that a shorter clock cycle is used to generate a digital value of a less significant bit, and sets at least one of the plurality of clock cycles used by the second analog-to-digital convertor longer than a shortest one of the plurality of clock cycles used by the first analog-to-digital convertor.

According to the above configuration, since a longest clock cycle to be used by the second analog-to-digital convertor which generates the digital values of the less significant bits is set longer than the clock cycles to be used by the first analog-to-digital convertor, the second analog-to-digital convertor can process half or more of a total number of bits of the digital output signal. Herewith, the second analog-to-digital convertor drops the gain of the amplifier as the process continues to a less significant bit to reduce clock cycles. Thus, high-speed analog-to-digital conversion of a large number of bits is allowed by the hybridized analog-to-digital conversion process configured of the analog-to-digital conversion process for more significant bits where high gain is required, and analog-to-digital conversion process for less significant bits that can be speeded up.

Moreover, the clock control units included in the analog-to-digital conversion apparatuses according to the embodiments 1 and 2 are achieved typically, in system LSIs which are integrated circuits. These may be mounted on one chip, or a part or the whole of the system LSIs may be mounted on one chip.

Moreover, the integrated circuit is not limited to the LSI and may be implemented in a dedicated circuit or a general-purpose processor. A field programmable gate array (FPGA) which is programmable after manufacturing the LSI, or a reconfigurable processor in which connection or settings of circuit cells within LSI is reconfigurable may be used.

Moreover, numerals used in the above are merely illustrative for specifically describing the present disclosure and the present disclosure is not limited thereto. Furthermore, the switching states represented by the high-level and the low-level are illustrative for specifically describing the present disclosure, and a different combination of the illustrated switching states can achieve the equivalent result. Moreover, the transistors, such as n-type and p-type are illustrative for specifically describing the present disclosure, and inverting these can also achieve the equivalent result. Moreover, the connection between the components is merely illustrative for specifically describing the present disclosure, and connection implementing the functionality of the present disclosure is not limited thereto.

Moreover, the division of the functional blocks in the block diagrams is illustrative. A plurality of functional blocks may be implemented in one functional block, one functional block may be divided into plural, or part of the functionality may be moved to another functional block, for example. Moreover, similar functionality among a plurality of functional blocks may be processed by a single piece of hardware or software in parallel or in a time-sharing manner.

Moreover, while in the above description, the examples have been given with reference to the MOS transistors, another type of transistor may be used.

Moreover, the circuit structures illustrated in the circuit diagrams described above are illustrative, and the present disclosure is not limited to the above circuit structures. In other words, circuits which can implement the characteristic features of the present disclosure, as with the circuit structures, are included in the present disclosure. For example, a certain element having an element, such as a switching element (transistor), a resistance element, or a capacitor element connected thereto in series or in parallel is included in the present disclosure to an extent that can achieve the similar functionality obtained from the circuit structures described above. In other words, "connected" in the above embodiments is not limited to two terminals (nodes) being connected directly, and includes the two terminals (nodes) being connected via an element to an extent that can achieve the similar functionality.

Furthermore, various modifications to the embodiments 1 and 2 that may be conceived by those skilled in the art are included in the present disclosure, without departing from the spirit of the present disclosure.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present disclosure is useful for, for example, temperature sensors, imaging devices, digital cameras, and batteries incorporating analog-to-digital convertors required for high-speed analog-to-digital conversion of a large number of bits.

The invention claimed is:

1. An analog-to-digital conversion apparatus for performing analog-to-digital conversion on an analog input signal into a digital output signal, comprising:
   a second or higher order $\Delta\Sigma$ analog-to-digital converter which receives input of the analog input signal and generates a digital modulated signal including more significant bits; and
   a cyclic analog-to-digital converter which receives input of an analog signal and generates a multi-bit digital value of less significant bits, the analog signal being included in the analog input signal and having not been subjected to $\Delta\Sigma$ processing by the $\Delta\Sigma$ analog-to-digital converter.

2. The analog-to-digital conversion apparatus according to claim 1, wherein
   the $\Delta\Sigma$ analog-to-digital converter includes a first inverting amplifier and a second inverting amplifier, and
   the cyclic analog-to-digital converter includes at least one of the first inverting amplifier or the second inverting amplifier which is shared with the $\Delta\Sigma$ analog-to-digital converter.

3. The analog-to-digital conversion apparatus according to claim 1, further comprising:
   a binarization processing unit configured to demodulate the digital modulated signal generated by the $\Delta\Sigma$ analog-to-digital converter into a multi-bit digital value of the more significant bits; and
   a digital output unit configured to combine the multi-bit digital value of the less significant bits and the multi-bit digital value of the more significant bits to output the digital output signal.

4. The analog-to-digital conversion apparatus according to claim 1, further comprising
   a clock control unit configured to control clock cycles which are time periods where unit processes of the analog-to-digital conversion are performed by the $\Delta\Sigma$ analog-to-digital converter and the cyclic analog-to-digital converter, wherein
   the clock control unit is configured to set at least one of the clock cycles to be used by the cyclic analog-to-digital converter longer than a shortest one of the clock cycles to be used by the $\Delta\Sigma$ analog-to-digital converter.

5. The analog-to-digital conversion apparatus according to claim 4, wherein
   the clock control unit is configured to set the clock cycles to be used by the cyclic analog-to-digital converter so that a shorter clock cycle is used to generate a less significant bit.

6. The analog-to-digital conversion apparatus according to claim 1, wherein
   the number of bits of digital values generated by the cyclic analog-to-digital converter is half or more of a total number of bits of the digital output signal.

7. An analog-to-digital conversion apparatus comprising:
   a first analog-to-digital convertor which generates digital values of more significant bits in clock cycles;
   a second analog-to-digital convertor which generates digital values of less significant bits in clock cycles; and
   a clock control unit configured to control the clock cycles which are time periods where the first analog-to-digital convertor and the second analog-to-digital convertor perform unit processes of analog-to-digital conversion, wherein
   the clock control unit is configured to set the clock cycles to be used by the second analog-to-digital convertor so that a shorter clock cycle is used to generate a digital value of a less significant bit, and set at least one of the clock cycles to be used by the second analog-to-digital convertor longer than a shortest one of the clock cycles to be used by the first analog-to-digital convertor.

8. An analog-to-digital conversion method for performing analog-to-digital conversion on an analog input signal into a digital output signal, comprising:
   (a) generating digital values of more significant bits through a second or higher order $\Delta\Sigma$ analog-to-digital conversion process; and
   (b) generating digital values of less significant bits through a cyclic analog-to-digital conversion process.

9. The analog-to-digital conversion method according to claim 8, wherein in step (a), the digital values of the more significant bits are generated in clock cycles, and in step (b), at least a clock cycle that is used to generate a digital value of a most significant bit among the less significant bits is set longer than a shortest one of the clock cycles used in step (a).

10. The analog-to-digital conversion method according to claim 9, wherein in step (b), a clock cycle to be used to generate a digital value is set shorter for a less significant bit.

* * * * *